(12) United States Patent
Kondo et al.

(10) Patent No.: US 6,300,555 B1
(45) Date of Patent: Oct. 9, 2001

(54) SOLAR CELL MODULE

(75) Inventors: Masataka Kondo, Kobe; Atsushi Takenaka, Otsu, both of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/403,613

(22) PCT Filed: Jul. 17, 1998

(86) PCT No.: PCT/JP98/03241

§ 371 Date: Nov. 5, 1999

§ 102(e) Date: Nov. 5, 1999

(87) PCT Pub. No.: WO99/07022

PCT Pub. Date: Feb. 11, 1999

(30) Foreign Application Priority Data

Jul. 29, 1997 (JP) .................................................. 9-202890
Jul. 29, 1997 (JP) .................................................. 9-202891
Apr. 28, 1998 (JP) .................................................. 10-118682

(51) Int. Cl.$^7$ .................................................. H01L 25/00
(52) U.S. Cl. .................................................. 136/244; 136/251
(58) Field of Search .................................................. 136/244, 251

(56) References Cited

U.S. PATENT DOCUMENTS

| 4,224,081 | * | 9/1980 | Kawamura et al. | 136/251 |
| 4,611,090 | | 9/1986 | Catella et al. | 136/251 |
| 5,460,660 | | 10/1995 | Albright et al. | 136/251 |
| 5,571,338 | | 11/1996 | Kadonome et al. | 136/251 |

FOREIGN PATENT DOCUMENTS

| 0419775A2 | 4/1991 | (EP) . |
| 0845816A1 | 6/1998 | (EP) . |
| 58-54679 | 3/1983 | (JP) . |
| 59-18450 | 2/1984 | (JP) . |
| 63-143879 | 6/1988 | (JP) . |
| 63-178354 | 11/1988 | (JP) . |
| 25-59591 | 8/1993 | (JP) . |
| 6-181333 | 6/1994 | (JP) . |
| 8-56006 | 2/1996 | (JP) . |
| 8-64854 | 3/1996 | (JP) . |
| 8-148710 | 6/1996 | (JP) . |
| 8-260638 | 10/1996 | (JP) . |
| WO 9707549 | 2/1997 | (JP) . |
| 9-69644 | 3/1997 | (JP) . |

* cited by examiner

Primary Examiner—Mark Chapman
(74) Attorney, Agent, or Firm—Birch, Stewart, Kolasch & Birch, LLP (57) ABSTRACT

A solar cell (1) and a support member (21) supporting the solar cell (1) are provided, the support member (21) has a metal portion, and between the solar cell (1) and the metal portion of the support member (21), a spacer (31) is provided. The spacer (31) has coefficient of thermal conductivity of at most $10^{-3}$W/cm·° C. and functions as an heat insulator, and/or resistivity of at least $10^{12}$Ω·cm and functions as an electrical insulator, and maintains its shape when the solar cell (1) is in a state of operation.

21 Claims, 5 Drawing Sheets

SOLAR CELL MODULE

This application is the national phase under 35U.S.C. § 371 of PCT International Application No. PCT/JP98/03241 which has an International filing date of Jul. 17, 1998, which designated the United States of America.

TECHNICAL FIELD

The present invention relates to a solar cell module and, more specifically, to a solar cell module used for solar electricity generation.

BACKGROUND ART

Recently, as the technique of solar electricity generation has been widely used, large number of solar cells using crystal silicon, amorphous based semiconductor and the like have come to be manufactured and installed on roofs in the shape of modules, or sold as structures integrated with the building material such as roof or wall of the buildings.

A thin film based solar cell module using an amorphous based semiconductor or the like allows mass production, and allows formation as a simple integrated structure on a substrate. Therefore, such solar cell module is advantageous in view of cost, and hence particularly attracting attention these days.

An outline of the manufacturing process of the thin film based solar cell module having the integrated structure on substrate is as follows. First, a transparent electrode layer of $SnO_2$ or the like is formed by thermal CVD method or the like, on a glass substrate, and patterned by laser processing or the like. Thereafter, a photo semiconductor layer is formed by plasma CVD method or the like thereon, and similarly patterned by laser processing or the like. Thereafter, a metal film, or a multi-layered film including a transparent electrode and metal as a back electrode layer is formed further thereon by vapor deposition or the like, and finally patterned, whereby a plurality of photo semiconductor devices are formed interconnected on one glass substrate. Simple interconnection is provided for taking out terminals, and thereafter, the back surface is sealed and protected by a filler and a back surface protective sheet, and thus a solar cell is completed. By putting the solar cell into a support member such as a frame formed of aluminum with sealing material formed of butyl rubber or the like interposed, a solar cell module can be fabricated in a simple manner.

Figure 7:
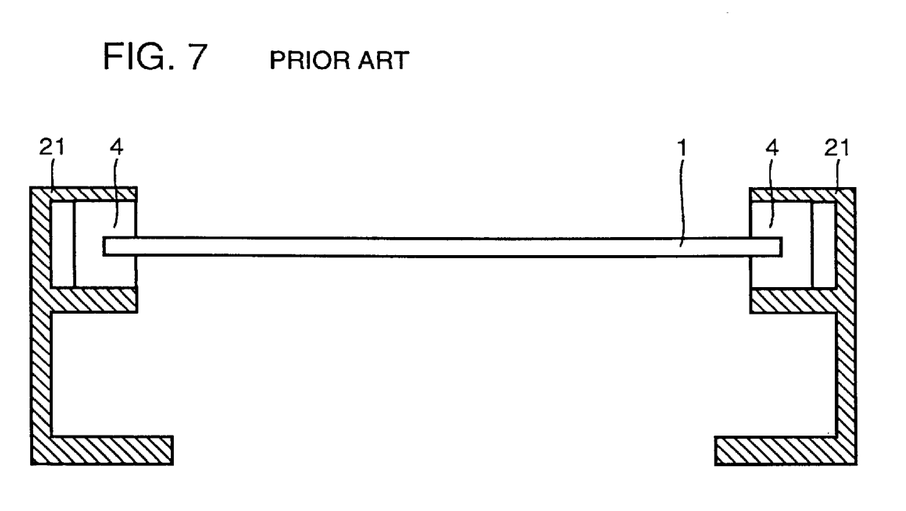
FIG. 7 is a cross sectional view representing a schematic structure of an example of a conventional thin film based solar cell module of an integrated structure on substrate.

FIG. 7 is a cross sectional view representing a schematic structure of one example of the conventional thin film based solar cell module having integrated structure on substrate.

Referring to FIG. 7, the solar cell module includes a solar cell 1, and an aluminum frame 21 supporting solar cell 1, and solar cell 1 is fitted in aluminum frame 21 with sealing material 4 of butyl rubber interposed.

Figure 8:
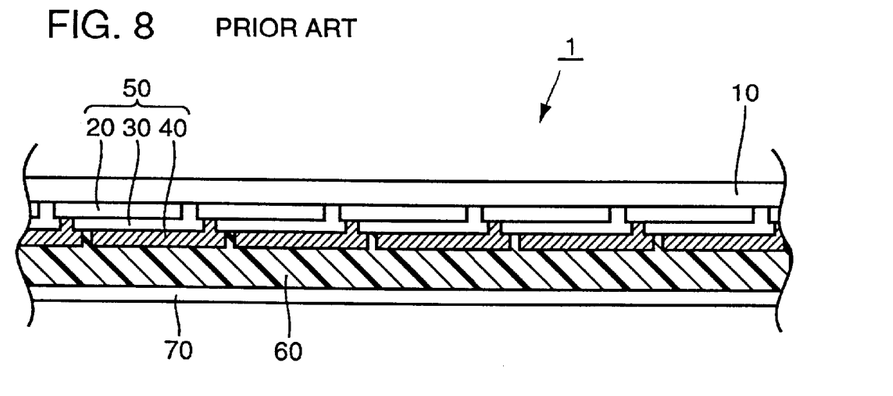
FIG. 8 is a partial cross sectional view representing, in enlargement, the solar cell of the solar cell module shown in FIG. 7.

FIG. 8 is a partial cross sectional view showing, in enlargement, solar cell 1 of the solar cell module shown in FIG. 7.

Referring to FIG. 8, solar cell 1 includes a glass substrate 10, and a plurality of photo semiconductor devices 50 formed of a transparent electrode layer 20, a photo semiconductor layer 30 and a back electrode layer 40 formed successively on glass substrate 10. A device forming surface (back surface) side of glass substrate 10 is sealed by a filler 60 and protected by a back surface protective sheet 70.

Figure 10:
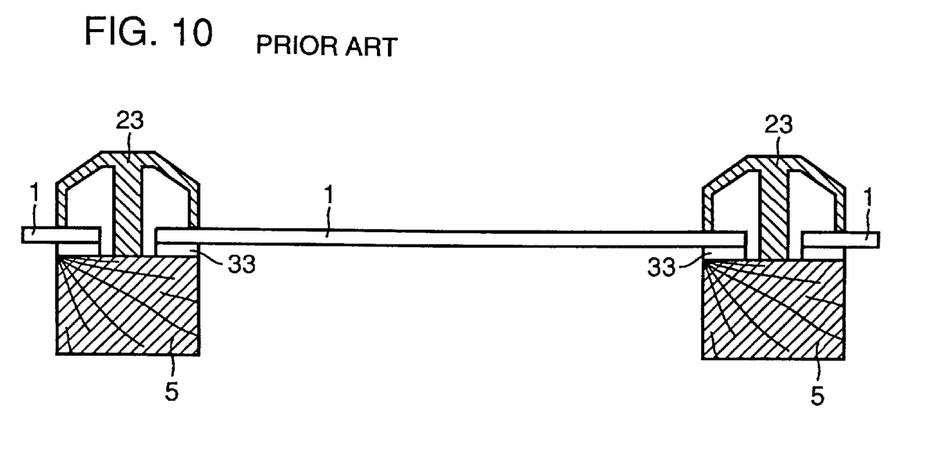
FIG. 10 is a cross sectional view representing a schematic structure of another example of the conventional thin film based solar cell module having integrated structure on substrate.

FIG. 10 is a cross sectional view representing a schematic structure of another example of the conventional thin film based solar cell module having the integrated structure on substrate. The solar cell module is designed assuming that it is to be installed on the roof of a building.

Referring to FIG. 10, the solar cell module includes a solar cell 1, a support base 5 supporting solar cell 1 and a pressing member 23. Support base 5 is formed of wood, and pressing member 23 is formed of aluminum. Further, support base 5 is adapted to be attachable on an iron plate (not shown) spread on the roof of a building. Further, between solar cell 1 and support base 5, a cushioning material 33 formed of polyurethane, for example, is interposed. The structure of solar cell 1 is completely the same as that shown in FIG. 8, and therefore, description thereof is not repeated.

Of the solar cell module structured as described above, not only stable electricity generating characteristic but also weather resistance against environment elements such as ultra violet ray, acid rain, heat and the like and strength against mechanical damage including cracks are important requirements on reliability, as the solar cell is installed at not easily accessible positions.

Though breakdown voltage of the conventional solar cell module measured between a power lead out terminal and the frame satisfied the JIS standard immediately after fabrication, a phenomenon of significant decrease in the breakdown voltage was observed in some samples, when measured after acceleration test at high temperature and high moisture.

Therefore, the inventors studied the cause of decrease in the breakdown voltage, and found that the conventional thin film based (substrate integrated type) solar cell module suffers from the following problem, as assembly structure of the supporting member supporting the solar cell, such as the frame or the pressing member, is the same as that for the crystal based solar cell module.

Figure 9:
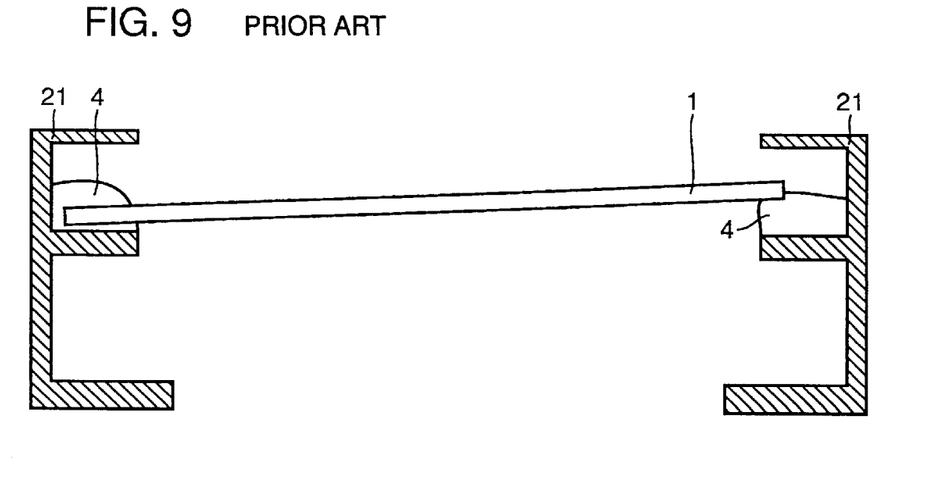
FIG. 9 illustrates a problem experienced in the conventional substrate integrated type thin film based solar cell module shown in FIG. 7.

FIG. 9 is an illustration representing the problem experienced in the conventional substrate integrated type thin film based solar cell module.

Referring to FIG. 9, in the conventional solar cell module, when solar cell 1 is assembled with frame 21, sealing member 4 formed of butyl rubber is interposed, which sealing member 4 of butyl rubber floats because of exposure for a long period of time. It was found that this causes movement of solar cell 1 in frame 21, resulting in contact between solar cell 1 and frame 21. Especially when the solar cell module is installed on an inclined roof, if sealing member 4 experiences plastic deformation, solar cell 1 easily moves downward because of the weight of solar cell 1.

In the thin film based solar cell 1 having such a structure as shown in FIG. 8, sometimes transparent electrode layer 20 may extend around third surfaces or to the light entering surface side opposite to the photo semiconductor device forming surface of glass substrate 10. In such a case, insulated state cannot be maintained if glass substrate 10 simply contacts frame 21. Particularly, in the solar cell module having such a structure as shown in FIG. 10, glass substrate 10 is in contact with pressing member 23 formed of aluminum, and it is difficult to maintain insulated state if there is a wraparound of transparent electrode 20.

Accordingly, the inventors considered measurement for insulation, by removing transparent electrode 20 formed extending around the periphery or an end portion of glass substrate 10 to attain similar condition as a crystal based solar cell module.

When an $SnO_2$ transparent electrode layer is to be formed on the glass substrate by the method of thermal CVD or the like, however, it is very difficult from the essential nature of gas phase reaction, to mask only the peripheral portion of the glass substrate so as to prevent formation of the $SnO_2$ layer.

A method of removing the $SnO_2$ layer at the peripheral portion of the glass substrate using a grinder or a chamfering apparatus together with the glass substrate after formation of the transparent electrode layer was also studied. This method, however, increased processing cost, and further, raised a problem that generated particles caused pin holes in the next step of forming photo semiconductor layer. Therefore, it was found that the method could not be used.

On the other hand, the inventors noted the problem of improving functional reliability of the solar cell module, in addition to the problem of decrease in breakdown voltage described above.

More specifically, in most cases, a fragile material such as glass or transparent ceramics is used as the glass substrate (hard transparent plate) on the side of the light entering surface of the solar cell. The reason for this is that it is far superior in weather resistance to transparent resin. As represented by the fact that the term "brittle" is easily associated with "glass", as is well known, glass and ceramics are disadvantageous in that they are fragile. One counter measure is use of a reinforced glass, for example. Considering the condition where the solar cell is installed outdoors for generating electricity, however, it should be noted that the temperature of the solar cell attains to high temperature of 70° C. or higher. The solar cell is adapted to have such a structure that has extremely high light absorptance to improve photo electric conversion efficiency, and therefore temperature increase is quite abrupt as compared with the structures of the aluminum frame or the roof. In an extreme case, there may be a temperature difference close to 50° C. from the periphery. As is well known, the frame and the like are formed of metal and have high thermal conductivity, and it was found by the inventors that a large temperature gradient generates in the (hard transparent plate) having small coefficient of thermal conductivity in operation. This is a factor significantly impairing mechanical reliability of the solar cell. It is well known that glass brittles when locally heated or cooled abruptly. The conventional solar cell module had the problem that possibility of such phenomenon caused in operation of the solar cell module was extremely high.

Particularly, the problem of mechanical reliability has been pointed out in the solar cell module having such a structure as shown in FIG. 10.

An object of the present invention is to solve the above described problems and to provide a solar cell module having superior breakdown voltage reliability and/or mechanical reliability.

DISCLOSURE OF THE INVENTION

In accordance with an aspect of the present invention, a solar cell module is provided. The solar cell module includes a solar cell and a support member supporting the solar cell, wherein the support member has a metal portion, a spacer is provided between the solar cell and the metal portion of the support member, the spacer has coefficient of thermal conductivity of at most $10^{-3}$W/cm·° C. and functions as a heat insulator, and maintains its shape when the solar cell in the state of operation.

Preferably, the solar cell includes a thin film photo electric converting device using amorphous silicon as an active layer, and heat insulating means is further provided on the back surface of the solar cell.

In accordance with another aspect of the present invention, a solar cell module is provided. The solar cell module include a solar cell and a support member supporting the solar cell, wherein the support member has a metal portion, a spacer is provided at least partially between the solar cell and the metal portion of support member, the spacer has resistivity of at least $10^{12}$Ω·cm and functions as an insulator, and maintains its shape when the solar cell is in the state of operation.

Preferably, the spacer is included in the entire region between the solar cell and the metal portion of the support member.

According to a still further aspect of the present invention, a solar cell module is provided. The solar cell module includes a solar cell and a support member supporting the solar cell, wherein the support member has a metal portion, a spacer is provided between the solar cell and the metal portion of the support member, the spacer has coefficient of thermal conductivity of at most $10^{-3}$W/cm·° C. and resistivity of at least $10^{12}$Ω·cm and functions as an electrical insulator and heat insulator, and maintains its shape when the solar cell is in the state of operation.

Preferably, the solar cell includes a thin film photoelectric converting device using amorphous as an active layer, and heat insulating means may further be provided on the back surface of the solar cell.

In the solar cell module in accordance with the present invention, the spacer may include a material selected from the group consisting of polycarbonate, polystyrene, foam resin, polyurethane, cellulose acetate, silicone, phenol resin, epoxy resin, glass fiber, asbestos, glass foam, acrylic foam, rubber foam body and cork.

BEST MODES FOR CARRYING OUT THE INVENTION

Figure 1:
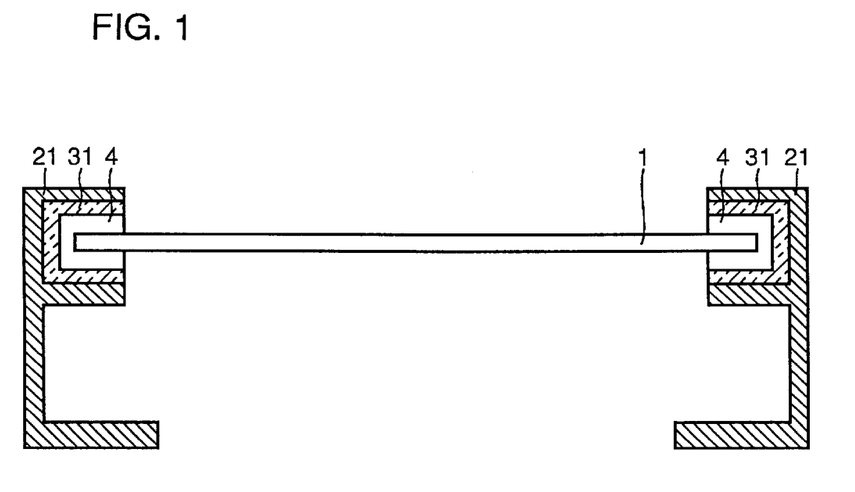
FIG. 1 is a cross sectional view representing a schematic structure of the solar cell module in accordance with a first embodiment of the present invention.

FIG. 1 is a cross sectional view representing a schematic structure of the solar cell module in accordance with a first embodiment of the present invention.

Referring to FIG. 1, the solar cell module includes a solar cell 1 and an aluminum frame 21 supporting solar cell 1. Between solar cell 1 and aluminum frame 21, a spacer 31 of heat insulating material having coefficient of thermal conductivity of at most $10^{-3}$ W/cm·° C. is interposed. In the present embodiment, between solar cell 1 and spacer 31 of heat insulating material, a sealing member 4 formed of butyl rubber is further interposed for assisting adhesion. The spacer 31 of heat insulating material may have resistivity of at least $10^{12}$ Ω·cm, so that its functions not only as a heat insulator but also as an electrical insulator.

Glass easily brittles when hot water is poured into a cold glass, or when heated glass is cooled abruptly. This is because temperature gradient is generated locally, resulting in thermal stress, which breaks glass. Therefore, when there is not the temperature gradient generated with the glass heated or cooled gradually, glass is not broken even at a high temperature of 500° C. or at such a low temperature as the temperature of liquid nitrogen. The present invention has been made noting such a natural phenomenon. More specifically, in order not to cause temperature gradient within the solar cell module, temperature gradient is suppressed by placing a spacer formed of heat insulating material at a portion where temperature gradient tends to generate, that is, the portion where metal and the solar cell are in contact with each other.

The solar cell in the present invention represents the solar cell module with the support member removed, or a similar component, which includes a photoelectric converting device and sealing means for protecting the photoelectric converting device against mechanical stress and environmental moisture, temperature, dust or the like. A so called frameless module is also encompassed.

One example of a specific structure for a crystal based solar cell includes one having transparent filler resin sheet such as EVA (ethylene-vinyl acetate copolymer) arranged on a hard transparent plate formed of reinforced glass or the like, solar cell devices formed on a silicon wafer arranged so that the transparent plate is on light entering surface side, interconnected with plated copper foil ribbon, provided with a lead out electrode or the like, and sealed by vacuum laminate method by successively arranging EVA and Tedler (registered trademark) films. The thin film based solar cell may include one completed by successively forming a transparent electrode layer of thin oxide, for example, a photo semiconductor layer and a back electrode layer of metal or the like directly on glass or reinforced glass, patterning respective layers by laser processing or the like to provide the solar cell device having an electricity generation portion and interconnecting portion in monolithic form, and sealing a device forming surface side opposing to the light entering surface side, by EVA and Tedler film and the like. Both crystal based and thin film based cells have a lead out electrode, a terminal box and the like formed on the device forming surface side opposite to the light entering surface side.

A further example of the solar cell includes one having a thin film based solar cell device of a smaller area arranged on a hard transparent plate in the similar manner as a crystal based solar cell, and a structure having flexible solar cell adhered on a back side of a hard transparent plate. The present invention is not limited to these examples and appropriately applicable provided that fragile material such as glass or ceramics is used as the hard transparent plate as a structural body maintaining its shape.

In the present invention, the support member refers to a metal frame of aluminum or the like for a unit solar cell module, and refers to a portion supporting the solar cell module serving also as a structural member of the roof such as wooden frame, for building material integrated type solar cell module. The metal portion of such a support member includes a frame, or a protective sheet or the like in the case of the building material integrated type solar cell module, for example.

As the heat insulating material having coefficient of thermal conductivity of at most $10^{-3}$ W/cm·° C., polycarbonate (coefficient of thermal conductivity: $0.86 \times 10^{-3}$ W/cm·° C.), polystyrene (coefficient of thermal conductivity: $0.35 \times 10^{-3}$ W/cm·° C.), foam resin (coefficient of thermal conductivity: at most $10^{-3}$ W/cm·° C.), polyurethane (coefficient of thermal conductivity: $0.17 \times 10^{-3}$ W/cm·° C.), cellulose acetate (coefficient of thermal conductivity: $0.43 \times 10^{-3}$ W/cm·° C.), silicone (coefficient of thermal conductivity: $0.43 \times 10^{-3}$ W/cm·° C.), phenol resin (coefficient of thermal conductivity: $0.35 \times 10^{-3}$ W/cm·° C.), epoxy resin (coefficient of thermal conductivity: $0.35 \times 10^{-3}$ W/cm·° C.), glass fiber (coefficient of thermal conductivity: $0.36 \times 10^{-3}$ W/cm·° C.), asbestos (coefficient of thermal conductivity: $0.44 \times 10^{-3}$ W/cm·° C.), glass foam (coefficient of thermal conductivity: $0.49 \times 10^{-3}$ W/cm·° C.), acrylic foam (coefficient of thermal conductivity: $0.29 \times 10^{-3}$ W/cm·° C.), rubber foam body (coefficient of thermal conductivity: at most $10^{-3}$ W/cm·° C.), cork (coefficient of thermal conductivity: at most $10^{-3}$ W/cm·° C.) or the like may preferably be used.

As to the shape of the spacer of heat insulating material, one in the shape of a tape or one molded to the shape of a rectangle with one side opened are readily available. The thickness of the spacer may appropriately be selected considering the relation between the fitting portion of the support member and the size of the solar cell. Preferable thickness is about 0.2 to 1 mm, in view of appearance of the finished product, efficiency in assembling process and so on. As to the specific product of the heat insulating material in the shape of a tape, a tape having an adhesive layer on one or both surfaces of a base material of acrylic foam resin is commercially available as an acrylic foam joining material, from 3M (Japanese Subsidiary: Sumitomo 3M).

It is necessary for the material of the spacer of heat insulating material to maintain its shape when the solar cell is in the state of operation. More specifically, it is necessary that deformation does not occur under the condition of operating temperature (about 90° C.) of the solar cell, while bearing the weight of the solar cell. The materials listed above are preferably used as the spacer of heat insulating material, as any of these can maintain its shape when the solar cell is in the state of operation. Though rubber such as butyl rubber, Neoprene and natural rubber all have the coefficient of thermal conductivity of at most $10^{-3}$ W/cm·° C., those sold as ones for solar cells have plasticity at a room temperature and have property close to that of putty, so that the rubber is prone to deformation when the solar cell is in the state of operation. Therefore, such rubber cannot be used as the spacer of heat insulating material. It should be noted, however, that among rubber foam bodies, there are materials which can maintain their shapes even when the solar cell is in the state of operation, dependent on vulcanization or blending.

When such a spacer of heat insulating material is to be interposed between the solar cell and the support member, the spacer of the heat insulating material may be attached to the solar cell and thereafter the cell is fitted in the support member or, alternatively, the spacer of the heat insulating material may be positioned within the support member and the solar cell may be fitted therein. In this manner, the solar cell module may appropriately be assembled dependent on the situation. What is important in the present invention is that direct contact between the solar cell and the support member is prevented over all areas, so as to prevent local temperature gradient. Especially in the solar cell module of which design is given priority in general, space at the fitting portion of the support member such as the frame is made narrow. Therefore, it is important that the solar cell and the support member are not in contact with each other in such a narrow space.

Recently, a solar cell using a thin film photoelectric converting device employing amorphous silicon as an active layer has been developed and attracting attention as promising in view of the material cost, energy payback time and other points. As of 1997, such a solar cell employing amorphous silicon has not yet been practically used for solar electricity generation. One of the most serious causes preventing practical use is degradation caused by irradiation with light (hereinafter simply referred to as "photo degradation"), which results in significant lowering in the photoelectric conversion efficiency. This phenomenon is referred to as Stebler-Wronskey effect, which is a reversible phenomenon mostly recovered by annealing at a temperature of about 100 to 200° C. without irradiation of light, after the occurrence of photo degradation. In the actual use of the solar cell, the photo degradation is settled in the first one year. However, the ratio of photo degradation in one without annealing, that is, one without any counter measure, attains as high as 30%.

Therefore, suppression of photo degradation by increasing operational temperature of the solar cell to cause anneal effect has been studied. More specifically, a structure having heat insulating means on the back surface of the solar cell, for example, a heat insulating material such as foam body, to attain the anneal effect has been proposed. In the solar cell module of such a structure, the temperature of the solar cell increases, whereas temperature increase in the support member portion is slight, and therefore, as compared with the normal example, larger temperature gradient may be generated in the glass substrate of the solar cell.

Figure 2:
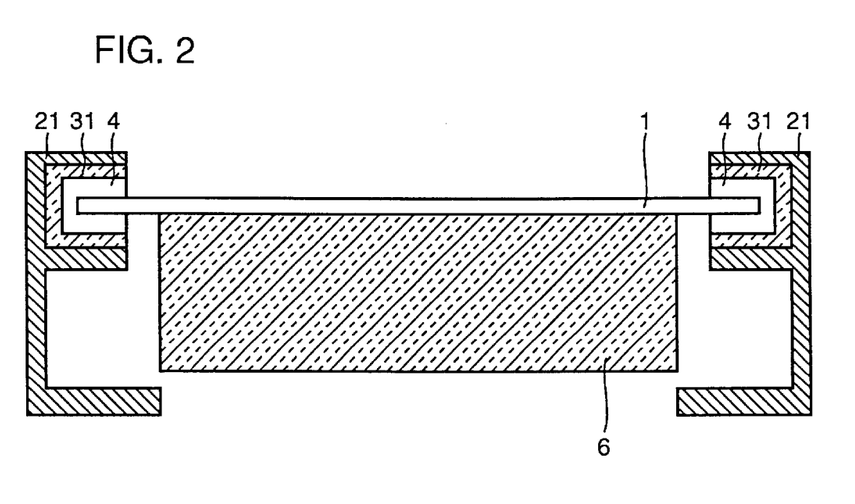
FIG. 2 is a cross sectional view representing a schematic structure of the solar cell module in accordance with a second embodiment of the present invention.

FIG. 2 is a cross sectional view representing a schematic structure of the solar cell module in accordance with the second embodiment of the present invention, representing an example of application of the present invention to a solar cell module including the solar cell with heat insulating means provided on the back surface, described above.

Referring to FIG. 2, the solar cell module includes a solar cell 1 including a thin film photoelectric converting device using amorphous silicon as an active layer, and a support member 21 supporting solar cell 1. Between solar cell 1 and support member 21, spacer 31 of heat insulating material having coefficient of thermal conductivity of at most $10^{-3}$W/cm·° C. is interposed, and between solar cell 1 and spacer 31 of heat insulating material, sealing material 4 of butyl rubber is further interposed for assisting adhesion. Spacer 31 of heat insulating material may have resistivity of at least $10^{12}\Omega$·cm, so that it serves not only as the heat insulating material but also as an electrical insulation material.

On the back surface of solar cell 1, heat insulating material 6 formed of foam body or the like is arranged as the heat insulating means. Other than providing such a heat insulating material as the heat insulating means, a container may be attached to the back surface of solar cell 1 so that there is generated a prescribed space of an air layer.

The effect of the present invention is particularly well exhibited in the solar cell module having such a structure, as the temperature gradient generated in the solar cell is significantly large as described above.

Figure 3:
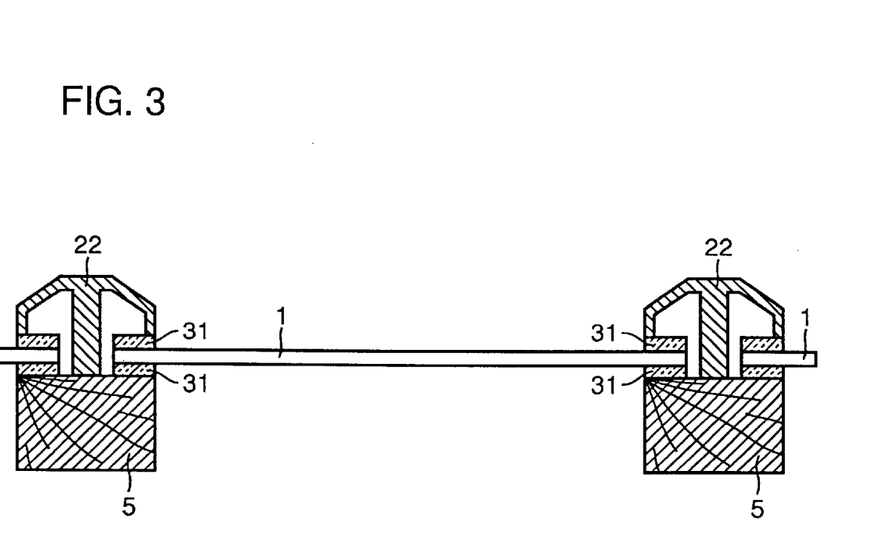
FIG. 3 is a cross sectional view representing a schematic structure of the solar cell module in accordance with a third embodiment of the present invention.

FIG. 3 is a cross sectional view representing a schematic structure of the solar cell module in accordance with a third embodiment of the present invention, representing an example of application of the present invention to a solar cell module having such a structure as shown in FIG. 10.

Referring to FIG. 3, in the solar cell module, spacer 31 of heat insulating material having coefficient of thermal conductivity of at most $10^{-3}$W/cm·° C. is interposed between solar cell 1 and support base 5 and between solar cell 1 and pressing member 22. Heat insulating material 31 may have resistivity of at least $10^{12}\Omega$·cm so that it may function not only as the heat insulator but also as an electrical insulator.

Except this point, the structure is completely the same as the solar cell module shown in FIG. 10, and therefore, description thereof is not repeated.

Figure 4:
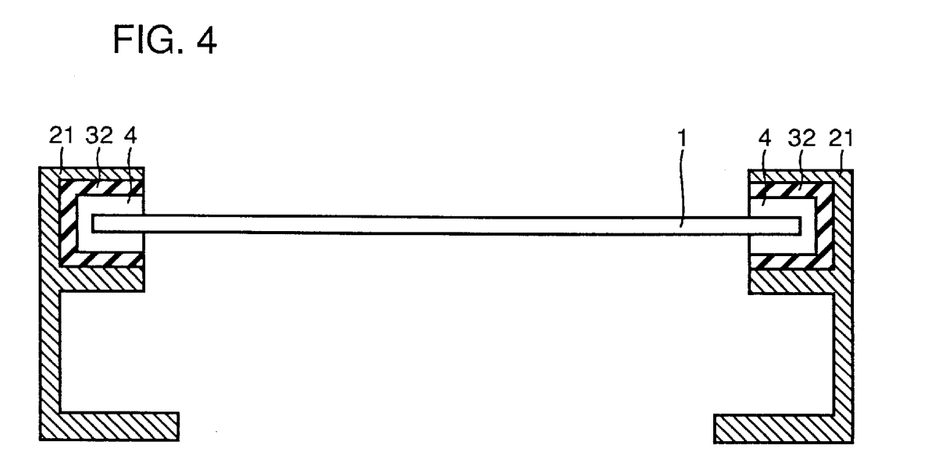
FIG. 4 is a cross sectional view representing a schematic structure of the solar cell module in accordance with a fourth embodiment of the present invention.

FIG. 4 is a cross sectional view representing a schematic structure of the solar cell module in accordance with the fourth embodiment of the present invention.

Referring to FIG. 4, in the solar cell module, between solar cell 1 and aluminum frame 21 as the support member, a spacer 32 of an electrically insulating material having resistivity of at least $10^{12}\Omega$·cm is interposed. Except this point, the structure is completely the same as the solar cell module in accordance with the first embodiment shown in FIG. 1. Therefore, description thereof is not repeated.

As the electrically insulating material having resistivity of at least $10^{12}\Omega$·cm, polycarbonate (resistivity: $10^{16}\Omega$·cm), polystyrene (resistivity: $10^{15}\Omega$·cm), foam resin (resistivity: at least $10^{12}\Omega$·cm), polyurethane (resistivity: at least $10^{12}\Omega$·cm), cellulose acetate (resistivity: $10^{13}\Omega$·cm), silicone (resistivity: $10^{15}\Omega$·cm), phenol resin (resistivity: $10^{12}\Omega$·cm), epoxy resin (resistivity: $10^{12}\Omega$·cm), glass fiber (resistivity: $10^{13}\Omega$·cm), asbestos (resistivity: $10^{13}\Omega$·cm), glass foam (resistivity: $10^{13}\Omega$·cm), acrylic foam (resistivity: $10^{15}\Omega$·cm), rubber foam body (resistivity: at least $10^{12}\Omega$·cm), cork (resistivity: at least $10^{12}\Omega$·cm) or the like may suitably be used.

As to the shape of the spacer of the electrically insulating material, one in the shape of a tape or one molded to the shape of a rectangle with one side opened are readily available. The thickness of the spacer may appropriately be selected considering the relation between the fitting portion of the support member and the size of the solar cell. Preferable thickness is about 0.2 to 1 mm, in view of appearance of the finished product, efficiency in assembling process and so on. As to the specific product of the heat insulating material in the shape of a tape, a tape having an adhesive layer on one or both surfaces of a base material of acrylic foam resin is commercially available as an acrylic foam joining material, from 3M (Japanese Subsidiary: Sumitomo 3M).

It is necessary for the material of the spacer of electrically insulating material to maintain its shape when the solar cell is in the state of operation. More specifically, it is necessary that deformation does not occur under the condition of operating temperature (about 90° C.) of the solar cell, while bearing the weight of the solar cell. The materials listed above are preferably used as the spacer of heat insulating material, as any of these can maintain its shape when the solar cell is in the state of operation. Though rubber such as butyl rubber, Neoprene and natural rubber all have the resistivity of at least $10^{12}\Omega$·cm, those sold as ones for solar cells have plasticity at a room temperature and have property close to that of putty, so that the rubber is prone to deformation when the solar cell is in the state of operation. Therefore, such rubber cannot be used as the spacer of heat insulating material. It should be noted, however, that among rubber foam bodies, there are materials which can maintain their shapes even when the solar cell is in the state of operation, dependent on vulcanization or blending.

Further, it is necessary for the material of the spacer of the electrically insulating material that resistivity thereof does not match change even when moisture or the like enters the fitting portion of the support member.

When such a spacer of electrically insulating material is to be interposed between the solar cell and the support member, the spacer of the electrically insulating material may be attached to the solar cell and thereafter the cell is fitted in the support member or, alternatively, the spacer of the electrically insulating material may be positioned within the support member and the solar cell may be fitted therein. In this manner, the solar cell module may appropriately be assembled dependent on the situation. What is important in the present invention is that direct contact between the solar cell and the support member is prevented over all areas. Especially in the solar cell module of which design is given priority in general, space at the fitting portion of the support member such as the frame is made narrow. Therefore, it is important that the solar cell and the support member are not in contact with each other in such a narrow space.

In order to prevent entrance of ionic moisture between the solar cell and the spacer of the electrically insulating material during long time of use, liquid shape sealing material such as butyl rubber, silicone or the like or an adhesive may appropriately be interposed between the solar cell and the spacer of the electrically insulating material, so as to further improve electrical insulation.

In the solar cell module in accordance with the fourth embodiment shown in FIG. 4, sealing material 4 of butyl rubber is interposed between solar cell 1 and spacer 32 of electrically insulating material.

Figure 5A:
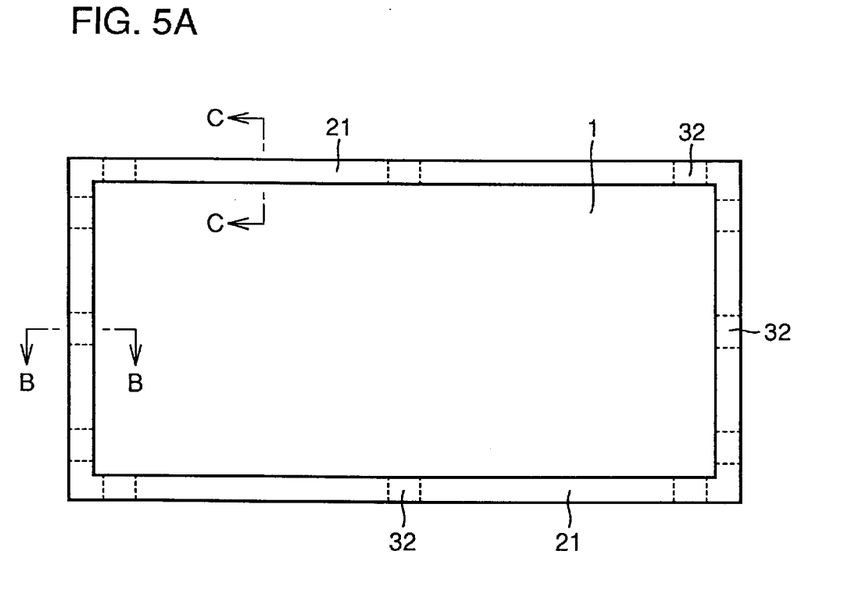
FIGS. 5A to 5C represent schematic structures of the solar cell module in accordance with a fifth embodiment of the present invention.
Figure 5B:
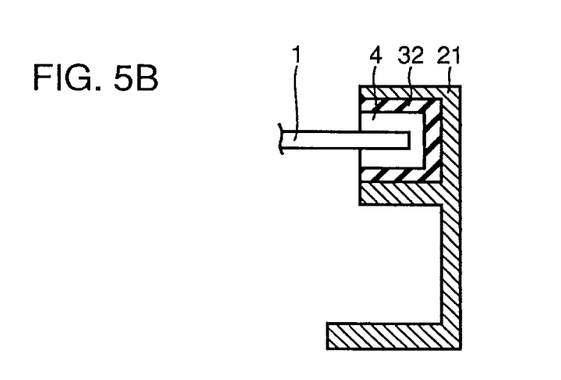
Figure 5C:
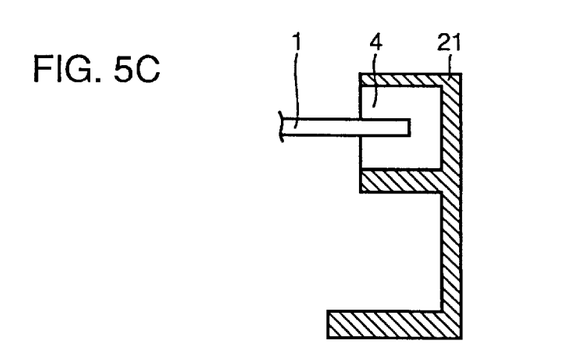

FIGS. 5A to 5C represent schematic structures of the solar cell module in accordance with the fifth embodiment of the present invention in which FIG. 5A is a plan view, FIG. 5B is a cross section taken along the line B—B of FIG. 5A and FIG. 5C is a cross sectional view taken along the line C—C of FIG. 5A.

Referring to FIGS. 5A to 5C, when use of a large amount of the sealing material is assumed, it is possible to implement one embodiment of the present invention by locally positioning spacer 32 of electrically insulating material so that support member 21 and solar cell 1 are not in direct contact with each other and by introducing sealing material 4 to the remaining spaces. In that case, a sealing material not having plasticity at the completed state such as silicone or thermosetting resin is preferred.

Figure 6:
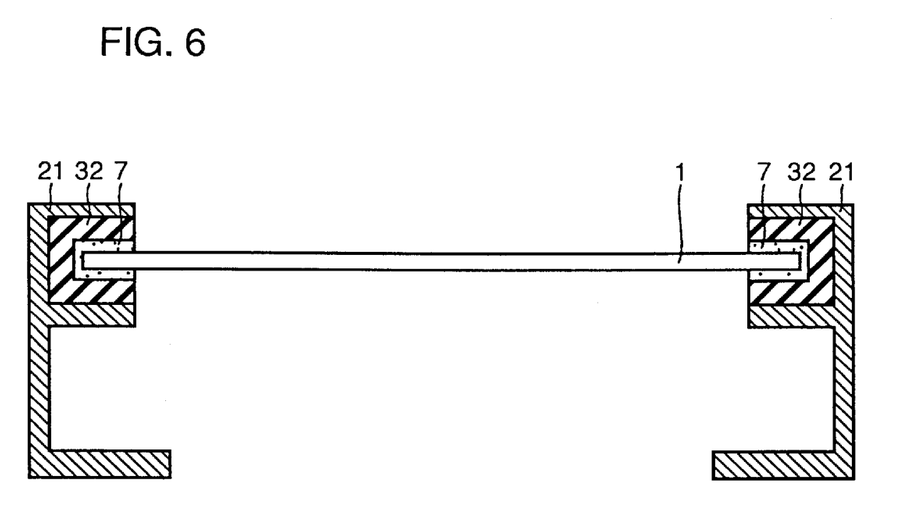
FIG. 6 is a cross sectional view representing a schematic structure of the solar cell module in accordance with a sixth embodiment of the present invention.

FIG. 6 is a cross sectional view representing a schematic structure of the solar cell module in accordance with a sixth embodiment of the present invention.

Referring to FIG. 6, when spacer 32 of the electrically insulating material is to be arranged in the overall area between the solar cell 1 and support member 21, it is possible to adhere solar cell 1 and spacer 32 of electrically insulating material by means of an adhesive 7 so as to additionally attain the purpose of preventing entrance of moisture.

Specific examples will be described in the following.

EXAMPLE 1

The solar cell module in accordance with the first embodiment of the present invention having such a structure as shown in FIG. 1 was fabricated.

As solar cell 1, a solar cell of the type in which light enters from the side of the glass substrate and having back surface of an amorphous silicon integrated type photoelectric converting device sealed by EVA and Tedler was used. As support member 21, an aluminum frame was used. As spacer 31 of heat insulating material to be interposed between support member 21 and solar cell 1, "tape for VHB structure Y-4950" manufactured by 3M company, which was an acrylic foam body (coefficient of thermal conductivity: $2.9 \times 10^{-4}$ W/cm·° C., resistivity: $10^{15}$ Ω·cm, thickness: 1.14 mm) was used. Further, for protection and adhesion, sealing material 4 of butyl rubber was interposed between solar cell 1 and spacer 31 of heat insulating material.

Temperature of the portion of solar cell 1 and temperature of the portion of frame 21 of the solar cell module of Example 1 obtained in this manner were measured at culmination of clear summer day at the temperature of 32° C. As a result, the temperature of the portion of solar cell 1 was 55° C., and the temperature of the portion of frame 21 was 40° C.

Further, an experiment was conducted in which frame 21 was cooled forcefully and irradiated with artificial sun light of 10SUN (ten times the standard sun light: 1000 mW/cm$^2$). As a result, crack was not observed among ten solar cell modules.

COMPARATIVE EXAMPLE 1

The conventional solar cell module having such a structure as shown in FIG. 7 was fabricated.

Solar cell 1 and frame 21 similar to those of Example 1 were used. Further, sealing material 4 of butyl rubber was interposed between solar cell 1 and frame 21.

Temperature of the portion of solar cell 1 and temperature of the portion of frame 21 of the solar cell module of Comparative Example 1 obtained in this manner were measured at culmination of clear summer day at the temperature of 32° C. As a result, the temperature of the portion of solar cell 1 was 50° C., and the temperature of the portion of frame 21 was 40° C., and temperature gradient of 10° C. was generated in the glass substrate of solar cell 1.

Further, an experiment was conducted in which frame 21 was cooled forcefully and irradiated with artificial sun light of 10SUN. As a result, two solar cell modules were broken among ten solar cell modules.

EXAMPLE 2

The solar cell module in accordance with the second embodiment of the present invention having such a structure as shown in FIG. 2 was fabricated.

As heat insulating material 6 to be provided on the back surface of solar cell 1, "Kaneka light foam heat max" fabricated by KANEKA CORPORATION (coefficient of thermal conductivity: $3.4 \times 10^{-4}$ W/cm·° C., resistivity: $10^{12}$ Ω·cm, thickness: 25 mm) was used, and adhered on the back surface of solar cell 1 using a rubber based adhesive. Except this point, the structure was completely the same as in Example 1.

Temperature of the portion of solar cell 1 and temperature of the portion of frame 21 of the solar cell module of Example 2 obtained in this manner were measured at culmination of clear summer day at the temperature of 32° C. As a result, the temperature of the portion of solar cell 1 was 70° C., and the temperature of the portion of frame 21 was 40° C. A large temperature gradient was generated at the portion of heat insulating material 6, while temperature gradient was hardly generated in the glass substrate of solar cell 1.

Further, an experiment was conducted in which frame 21 was cooled forcefully and irradiated with artificial sun light of 10SUN. As a result, crack was not observed among ten solar cell modules.

EXAMPLE 3

The solar cell module in accordance with the third embodiment in accordance with the present invention having such a structure as shown in FIG. 3 was fabricated.

As the spacer 31 of heat insulating material to be interposed between solar cell 1 and support base 5 and between solar cell 1 and pressing member 22 formed of aluminum, "tape for VHB structure Y-4950" manufactured by 3M company, which was an acrylic foam body, was used, as in Example 1.

Temperature of the portion of solar cell 1 and temperature of the portion of pressing member 22 of the solar cell module of Example 3 obtained in this manner were measured at culmination of clear summer day at the temperature of 32° C. As a result, the temperature of the portion of solar cell 1 was 70° C., and the temperature of the portion of pressing member was 35° C.

Further, an experiment was conducted in which pressing member 22 was cooled forcefully and irradiated with artificial sun light of 10SUN. As a result, crack was not observed among ten solar cell modules.

EXAMPLE 4

The solar cell module in accordance with the fourth embodiment of the present invention having such a structure as shown in FIG. 4 was fabricated.

As spacer 32 of electrically insulating material to be interposed between solar cell 1 and frame 21, "tape for VHB structure Y-4920" manufactured by 3M company, which was an acrylic foam body (coefficient of thermal conductivity: $2.9 \times 10^{-4}$ W/cm·° C., resistivity: $10^{15}$ Ω·cm, thickness: 0.4 mm), was used. Except this point, the structure was completely the same as that of Example 1.

Breakdown voltage of the solar cell module of Example 4 obtained in this manner was measured, which was 3000 V.

Thereafter, the solar cell module was put in an oven, heat-treated for one hour at a temperature of 80° C., followed by heat treatment for one hour at a temperature of 100° C. and further followed by heat treatment for one hour at a temperature of 120° C., and change in the breakdown voltage after heat treatment was successively measured. As a result, no change was observed in the breakdown voltage after heat treatment.

COMPARATIVE EXAMPLE 2

Breakdown voltage of the solar cell module obtained in accordance with Comparative Example 1 was measured, which was 3000 V.

Then, the solar cell module was put in an oven, heat-treated for one hour at a temperature of 80° C., followed by heat treatment for one hour at a temperature of 100° C. and further followed by heat treatment for one hour at a temperature of 120° C., and change in the breakdown voltage after heat treatment was successively measured. As a result, breakdown voltage was lowered to 2000 V after heat treatment at 100° C., and lower than 1000 V after heat treatment at 120° C.

EXAMPLE 5

The solar cell module in accordance with the fifth embodiment of the present invention having such a structure as shown in FIGS. 5A to 5C was fabricated.

Spacer 32 of electrically insulating material interposed between solar cell 1 and frame 21 was placed at a total of 12 positions of opposing end portions and the central portions of respective sides of rectangular frame 21 as shown in FIG. 5A. Sealing material 4 was introduced to remaining spaces at the fitting portion of frame 21. As spacer 32 of electrically insulating material, "tape for VHB structure Y-4920" manufactured by 3M company, which was an acrylic foam body, was used as in Example 4. As sealing material 4, silicone was used. Except this point, the structure was completely the same as that of Example 1.

Breakdown voltage of the solar cell module of Example 5 obtained in this manner was measured, which was 3000 V.

Thereafter, the solar cell module was put in an oven, heat-treated for one hour at a temperature of 80° C., followed by heat treatment for one hour at a temperature of 100° C. and further followed by heat treatment for one hour at a temperature of 120° C., and change in the breakdown voltage after heat treatment was successively measured. As a result, no change was observed in the breakdown voltage after heat treatment.

EXAMPLE 6

A solar cell module in accordance with the sixth embodiment of the present invention having such a structure as shown in FIG. 6 was fabricated.

Spacer 32 of electrically instructing material was interposed over entire area between solar cell 1 and frame 21. Spacer 32 of electrically insulating material was attached tightly on solar cell 1 by using an adhesive 7, and sealing material such as used in Example 5 was not used.

As spacer 32 of electrically insulating material, "tape for VHB structure Y-4920" manufactured by 3M company, which was an acrylic foam body, was used as in Example 4. Except this point, the structure was completely the same as that of Example 1.

Breakdown voltage of the solar cell module of Example 6 obtained in this manner was measured, which was 3000 V.

Thereafter, the solar cell module was put in an oven, heat-treated for one hour at a temperature of 80° C., followed by heat treatment for one hour at a temperature of 100° C. and further followed by heat treatment for one hour at a temperature of 120° C., and change in the breakdown voltage after heat treatment was successively measured. As a result, no change was observed in the breakdown voltage after heat treatment.

Industrial Applicability

As described above, according to the present invention, by the provision of a spacer of a heat insulating material between the solar cell and a metal portion of the support member, it becomes possible to suppress temperature gradient generating within hard transparent plate such as glass substrate, when the solar cell device is in operating condition. As a result, failure of the solar cell module such as cracks caused by thermal stress resulting from the temperature gradient can be prevented, and hence mechanical reliability of the solar cell module can be significantly improved. Further, by the provision of a spacer of an electrically insulating material between the solar cell and the metal portion of the support member, insulating characteristic comparative to that of a solar cell module employing a crystal based solar cell can be attained even in a solar cell module employing a thin film based solar cell device in which the transparent electrode layer extends around the light entering surface side opposite to the side of the semiconductor device forming surface or to the side surfaces of the glass substrate. As a result, a thin film solar cell module having high breakdown voltage characteristic can be fabricated at a low cost. Further, by the provision of a spacer of electrical and heat insulating material between the solar cell and the metal portion of the support member, a solar cell module having superior mechanical reliability as well as superior breakdown voltage reliability can be obtained.

What is claimed is:

1. A solar cell module, comprising:
    a solar cell, and
    a support member supporting said solar cell; wherein
        said support member has a metal portion,
        a spacer is provided between said solar cell and said metal portion of said support member, and
        said spacer has coefficient of thermal conductivity of at most $10^{-3}$ W/cm·° C., functions as a heat insulator and maintain its shape when said solar cell is in a state of operation.

2. The solar cell module according to claim 1, wherein said solar cell includes a thin film photoelectric converting device using amorphous silicon as an active layer,
    said solar cell module further comprising
        heat insulating means provided on a back surface of said solar cell.

3. The solar cell module according to claim 1, wherein said spacer includes any material selected from the group consisting of polycarbonate, polystyrene, foam resin, polyurethane, cellulose acetate, silicone, phenol resin, epoxy resin, glass fiber, asbestos, glass foam, acrylic foam, rubber foam body and cork.

4. The solar cell module according to claim 1, wherein the spacer has a tape shape or a rectangle shape with one side opened.

5. The solar cell module according to claim 1, wherein the spacer has a thickness of about 0.2 to 1 mm.

6. A solar cell module, comprising:
    a solar cell; and
    a support member supporting said solar cell; wherein
        said support member has a metal portion,
        a spacer is provided at least partially between said solar cell and said metal portion of said support member, and
        said spacer has resistivity of at least $10^{12}$ Ω·cm, functions as an electrical insulator, and maintains its shape when said solar cell is in a state of operation.

7. The solar cell module according to claim 6, wherein said spacer is provided on entire region between said solar cell and said metal portion of said support member.

8. The solar cell module according to claim 6, wherein said spacer includes any material selected from the group consisting of polycarbonate, polystyrene, foam resin, polyurethane, cellulose acetate, silicone, phenol resin, epoxy resin, glass fiber, asbestos, glass foam, acrylic foam, rubber foam body and cork.

9. The solar cell module according to claim 6, wherein the spacer has a tape shape or a rectangle shape with one side opened.

10. The solar cell module according to claim 6, wherein the spacer has a thickness of about 0.2 to 1 mm.

11. The solar cell module according to claim 6, which further comprises a sealing material interposed between the solar cell and the spacer.

12. The solar cell module according to claim 11, wherein the sealing material comprises butyl rubber.

13. A solar cell module, comprising:
    a solar cell; and
    a support member supporting said solar cell; wherein
        said support member has a metal portion,
        a spacer is provided between said solar cell and said metal portion of said support member, and
        said spacer has coefficient of thermal conductivity of at most $10^{-3}$ W/cm·° C. and resistivity of at least $10^{12}$ Ω·cm, functions as a heat insulator and an electrical insulator, and maintains its shape when said solar cell is in a state of operation.

14. The solar cell module according to claim 13, wherein
    said solar cell includes a thin film photoelectric converting device using amorphous silicon as an active layer,
    said solar cell module further comprising
        heat insulating means provided on a back surface of said solar cell.

15. The solar cell module according to claim 13, wherein said spacer includes any material selected from the group consisting of polycarbonate, polystyrene, foam resin, polyurethane, cellulose acetate, silicone, phenol resin, epoxy resin, glass fiber, asbestos, glass foam, acrylic foam, rubber foam body and cork.

16. The solar cell module according to claim 13, wherein the spacer has a tape shape or a rectangle shape with one side opened.

17. The solar cell module according to claim 13, wherein the spacer has a thickness of about 0.2 to 1 mm.

18. The solar cell module according to claim 13, which further comprises a sealing material interposed between the solar cell and the spacer.

19. The solar cell module according to claim 18, wherein the sealing material comprises butyl rubber.

20. The solar cell module according to claim 13, which further comprises a sealing material interposed between the solar cell and the spacer.

21. The solar cell module according to claim 20, wherein the sealing material comprises butyl rubber.

* * * * *